United States Patent
Chen et al.

(10) Patent No.: US 8,359,557 B1
(45) Date of Patent: Jan. 22, 2013

(54) METHOD AND APPARATUS FOR GENERATING DATA BUS INTERFACE CIRCUITRY

(75) Inventors: Xi Chen, Santa Clara, CA (US); Jibin Han, Longmont, CO (US); Paulo L. Dutra, San Jose, CA (US); Thien Than, Thornton, CO (US); Biping Wu, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/100,013

(22) Filed: May 3, 2011

(51) Int. Cl.
*G06F 17/50* (2006.01)
(52) U.S. Cl. .................................... 716/101; 716/106
(58) Field of Classification Search .............. 716/100, 716/101, 106; 710/110, 116
See application file for complete search history.

(56) References Cited

U.S. PATENT DOCUMENTS

| | | | |
|---|---|---|---|
| 2005/0177663 A1* | 8/2005 | Jeong | 710/110 |
| 2007/0186020 A1* | 8/2007 | Drexler et al. | 710/119 |
| 2009/0300568 A1* | 12/2009 | Kuroda | 716/10 |

OTHER PUBLICATIONS

Synopsys, Datasheet, "DesignWare IP solutions for the AMBA interconnect", 2009, 1-4 pp., Mountain View, CA USA.
Synopsys, Datasheet, "Synopsys coreTools, IP Based Design and Verification", 2008, 1-3 pp., Mountain View, CA USA.
Ptak, David, "Connecting an AMBA 2.0 AHB Slave to an AMBA 3 AXI Subsystem", Jan. 2006, 1-7 pp., Synopsys, Inc., Mountain View, CA USA.

* cited by examiner

*Primary Examiner* — Vuthe Siek
*Assistant Examiner* — Mohammed Alam
(74) *Attorney, Agent, or Firm* — LeRoy D. Maunu

(57) ABSTRACT

A method is provided for generation of a circuit design. A plurality of components, including at least a processor and a peripheral device, is instantiated in a circuit design. One or more parameterizable data bus interface blocks are automatically selected based on the master-slave relationships, requirements, and capabilities of the components. The one or more parameterizable data bus interface blocks are instantiated in the circuit design. In response to user input, values are assigned to one or more parameters of the processor. The plurality of components and data bus interface blocks are automatically parameterized by determining appropriate parameter values according to the parameters of the processor and capabilities and requirements of the components and data bus interface blocks.

19 Claims, 9 Drawing Sheets

METHOD AND APPARATUS FOR GENERATING DATA BUS INTERFACE CIRCUITRY

FIELD OF THE INVENTION

One or more embodiments generally relate to inter-circuit communication.

BACKGROUND

Complex integrated circuits (ICs) can be designed using various levels of abstraction. Using a hardware description language (HDL), circuits can be designed at the gate level, the register transfer level (RTL), and higher logical levels. When designing using an HDL, the designer describes the behavior of a system in terms of signals that are generated and propagated from one set of registers to another set of registers through combinatorial logic modules. HDLs provide a rich set of constructs to describe the functionality of each module. Modules may be combined and augmented to form even higher-level modules.

System-level integration may rely on reuse of previously created designs that have been provided either from within an enterprise or from a commercial provider. Libraries of pre-developed blocks of logic have been developed that can be selected and included in a circuit design. Such logic blocks include, for example, adders, multipliers, filters, and other arithmetic and digital signal processing (DSP) functions from which system designs can be readily constructed. The logic blocks may further include memories and storage elements. The engineering community sometimes refers to these previously created logic blocks as "design modules," "cores," "IP cores" (intellectual property cores), or "logic cores," and such terms may be used interchangeably herein. The use of pre-developed logic cores permits faster design cycles by eliminating the redesign of circuits. Thus, using cores from a library may reduce design costs. Such logic cores may often be available for purchase by parties who desire the functionality provided by the core, but do not have the time and/or resources necessary to design them.

Logic cores include a circuit design in the form of source code or a netlist that may be used in implementing the design in a programmable IC, such as a field programmable gate array (FPGA). Logic cores may be parameterizable. That is, the designer may specify values of parameters to tailor certain core functionality according to the designer's needs. The core may be integrated into a design by instantiating the code or netlist. The logic core is then placed and routed along with the rest of the design to provide the desired functionality.

Incorporation of a logic core into a larger design, however, may not be a simple task. For example, different logic cores included in a design may be configured to communicate using different bus protocols. In order to integrate a core, a designer often must create interface logic, sometimes referred to as "glue logic," to connect the logic core to a standard bus used in the design. Integration can be a time-consuming process.

SUMMARY

In one embodiment, a method is provided for generation of a circuit design. The embodiment of the method comprises instantiating in the circuit design in response to user input, a plurality of components including at least one processor and at least one peripheral device. The plurality of components has requirements, capabilities, and user-specified master-slave relationships. One or more parameterizable data bus interface blocks are automatically selected by a processor based on the master-slave relationships, requirements, and capabilities of the components. The one or more parameterizable data bus interface blocks are instantiated in the circuit design. In response to user input, values are assigned to one or more parameters of the processor. Data bus parameter values of the plurality of components and the one or more data bus interface blocks are automatically determined according to the parameters of the processor and capabilities and requirements of the plurality of components and one or more data bus interface blocks. The one or more data bus interface blocks and components are parameterized according to the determined data bus parameters.

In another embodiment, a method is provided for configuring communication parameters of a plurality of components in a circuit design. A respective value of a parameter of the one or more of the plurality of components in the circuit design is set, by a processor, for one or more of the plurality of components. For each component X of the plurality of components, the respective value of the parameter is propagated to each one of the plurality of components directly coupled to component X. In response to the respective value of the parameter propagated to one of the plurality of components, and being included in a set of compatible values of the parameter for the one component, the parameter of the one component is set to the propagated parameter value. In response to the respective value of the parameter propagated to the one component, the one component having the parameter set to a current value, and the propagated parameter value not included in the set of compatible values, the current value of the parameter of the one component is retained as the parameter value. If the value of the parameter of one or more of the plurality of components is changed in response to the propagating of the value, the propagating element is repeated.

In yet another embodiment, an article of manufacture is provided. The article is characterized by a non-transitory processor-readable medium configured with configuration data that, when executed by a processor, cause the processor to generate a circuit design. The instructions cause the processor to instantiate a plurality of components, including at least one processor and at least one peripheral device, in the circuit design in response to user input. The plurality of components having requirements, capabilities, and user-specified master-slave relationships. The processor selects one or more parameterizable data bus interface blocks based on the master-slave relationships, requirements, and capabilities of the components. The instructions direct the processor to instantiate the one or more parameterizable data bus interface blocks in the circuit design. The processor assigns values, in response to user input, to parameters of the processor. The instructions further cause the processor to determine data bus parameter values of the plurality of components and the one or more data bus interface blocks according to the parameters of the processor and capabilities and requirements of the plurality of components and one or more data bus interface blocks. The processor parameterizes the one or more data bus interface blocks and components according to the determined data bus parameters.

It will be appreciated that various other embodiments are set forth in the Detailed Description and Claims, which follow.

BRIEF DESCRIPTION OF THE DRAWINGS

Various aspects and advantages of one or more embodiments will become apparent upon review of the following detailed description and upon reference to the drawings in which:

FIGS. 5-1 through 5-7 illustrate an example parameterization of frequency;

FIG. 6 shows a programmable IC that may be configured according to one or more embodiments; and FIG. 7 illustrates a block diagram of a computing arrangement on which several processes described herein may be implemented.

DETAILED DESCRIPTION

Connecting component and peripheral sub-circuits in a circuit design is a complex task. A data bus connection network consists of several interconnect and bridge circuits. An appropriate connection network architecture must be selected to connect design components (processors, peripherals) using available interconnect and bridge IP-cores. The components and interfaces of the selected architecture generally include a large number of configurable options or parameters. Manual configuration of these parameters is error prone and requires designers to possess a requisite knowledge in the interconnect cores and sub-circuits included in the circuit design.

In one or more embodiments, a method is provided for generation of circuitry to connect components and peripherals included in a circuit design. The circuit design is augmented with interface logic allowing the components and peripherals to communicate over a data bus connection network. The interface logic is parameterized based on the requirements of the components and peripherals to be connected for communication. In one or more embodiments, a tool automatically selects an architecture, and instantiates and parameterizes the interface logic in the circuit design based on the requirements and capabilities of the components and peripherals included in the circuit design.

Data busses may be implemented using a number of data bus standards. For ease of explanation, the following embodiments and illustrative examples are described with reference to the Advanced Microcontroller Bus Architecture (AMBA) Advanced Extensible Interface (AXI). AMBA AXI is a standardized protocol for communicating between master and slave devices on a data bus. The AMBA AXI protocol is fully described in the AMBA 4.0 specification. An AXI data bus connection network can be implemented with a number of connection interfaces including: AXI-MM, AXI-Lite, AXI_Stream, etc, each having different capabilities and configurable values of parameters. For example, AXI-MM may be useful for high-performance applications requiring memory-mapping to perform automatic address assignment for components connected to the data bus. AXI-Lite provides a streamlined interface for simple, low-throughput memory-mapped communication. AXI-Stream provides for high-speed streaming data capabilities.

Figure 1:
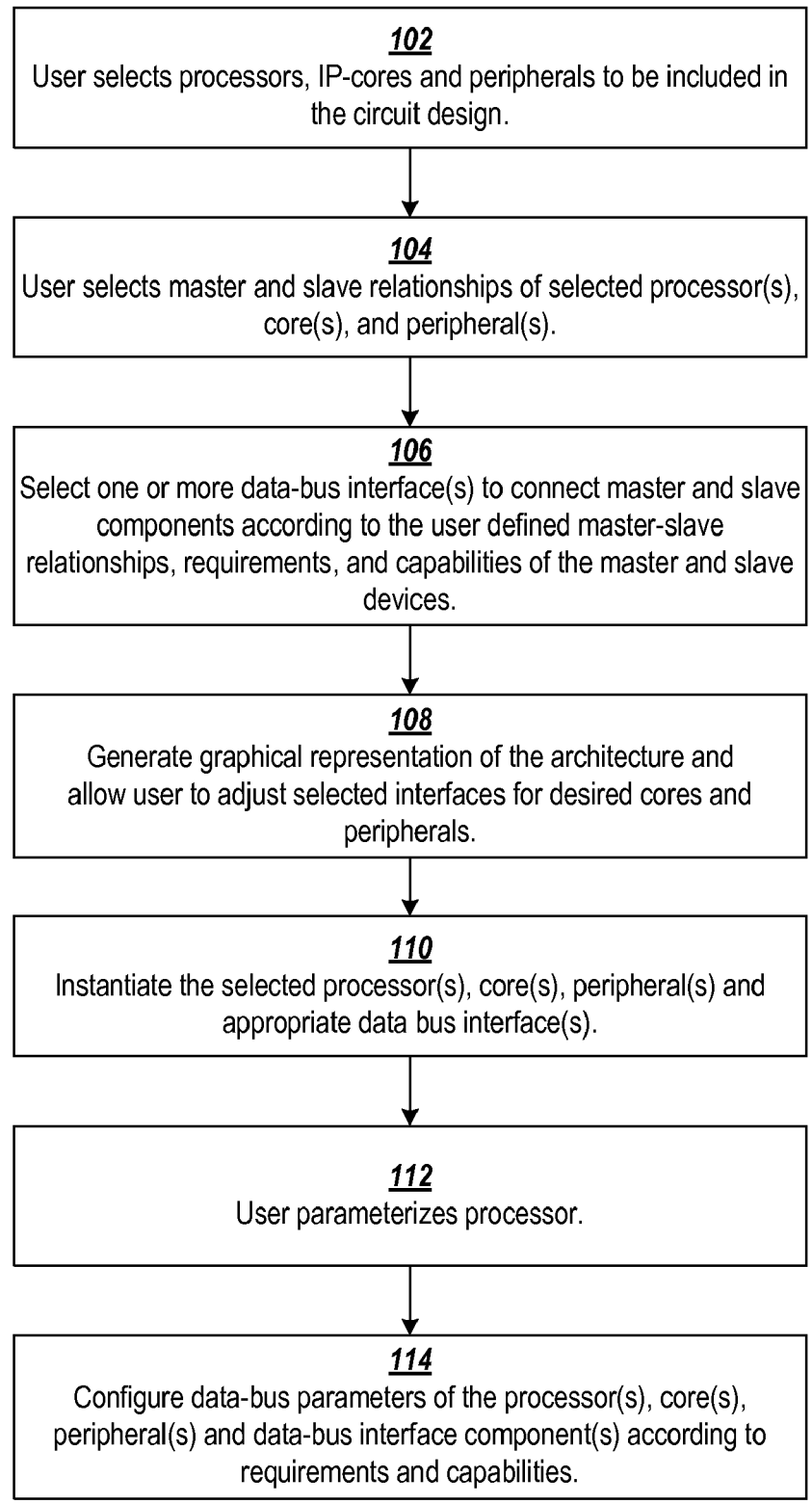
FIG. 1 shows a flowchart of an example method for automatically configuring a data bus and components in a circuit design.

FIG. 1 shows a flowchart of an example method for automatically configuring a data bus and components in a circuit design. A designer selects target FPGA hardware, one or more processors, and IP-cores or peripherals to be included in the circuit design at block 102. For ease of explanation, IP-Cores and peripherals that are included in the circuit design are both referred to as "peripherals." The designer selects master and slave relationships of selected processor(s) and peripherals at block 104. One or more data bus interface circuits are selected at block 106 to connect the components according to the user-defined master and slave relationships, along with requirements and capabilities of the master and slave components. For example, if a component requires data bursts greater than 256 cycles, AXI-stream may be selected to meet data burst requirements. On the other hand, if memory mapping functionality is required by the component, AXI-Lite or AXI-MM may be selected. A full description of capabilities of the AXI interfaces is described in the AMBA 4.0 specification. Requirements of the components and capabilities of data bus interface circuits may be retrieved from a database. In some embodiments, a graphical representation of the architecture is generated at block 108 to allow the user to review the architecture and adjust connectivity of components if desired.

Selected processor(s), peripheral(s) and appropriate data bus interfaces are instantiated in the design at block 110. The user parameterizes the processor at block 112. The user may also parameterize additional components at block 112 if desired. In some embodiments, one or more components may be initially parameterized using default parameter values retrieved from a database at step 112. Following initial parameterization, data bus parameters of the selected processor(s), peripheral(s) and data bus interfaces are configured at block 114, according to requirements and capabilities of the respective components.

Figure 3:
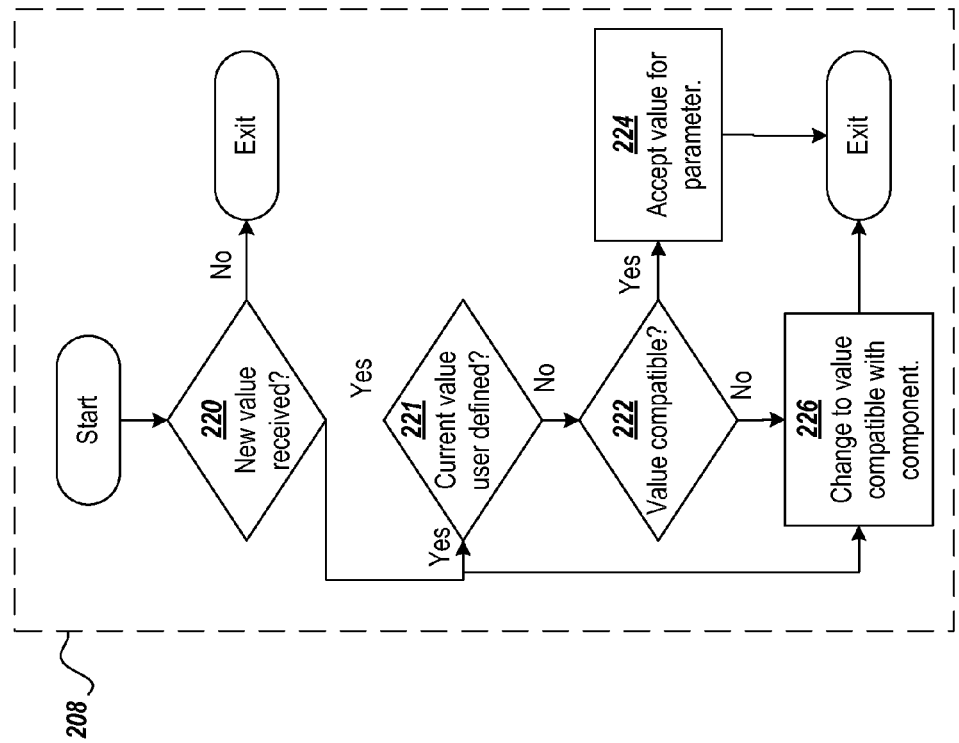
FIG. 3 shows a flowchart of an example method for adjusting parameters of components for compatibility.
Figure 2:
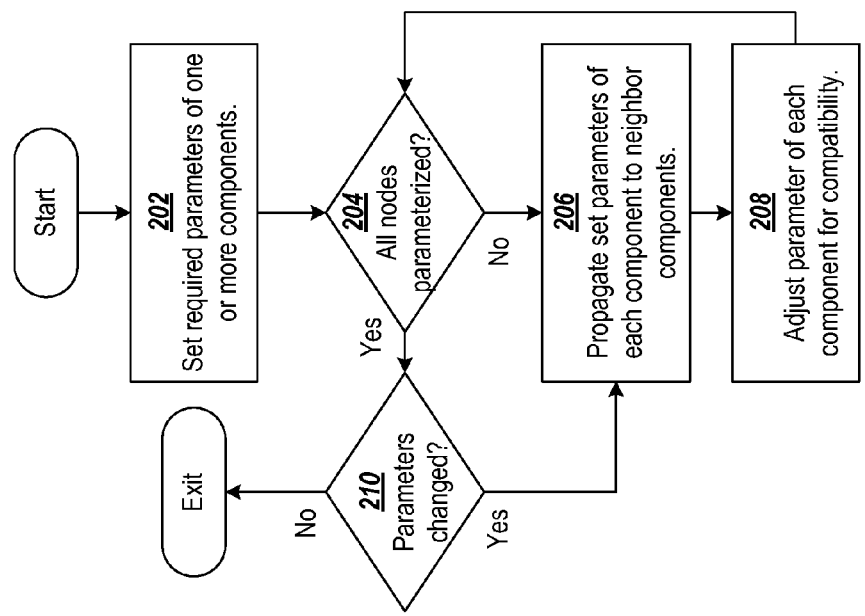
FIG. 2 shows a flowchart of an example method for parameterizing components.

FIG. 2 shows a flowchart of an example method for parameterization. Required values of one or more parameter(s) are set for one or more components at block 202. The required values of parameters may be derived from user input or from a database indicating the respective values required for each of the one or more components. For ease of explanation, the selected components to be included in the design, including the user-selected processors, components and peripherals, as well as data bus interface circuits generated in FIG. 1 may be collectively referred to as data bus "nodes" in this description. While one or more nodes remain unparameterized at decision block 204, values of the parameters are propagated from each data bus node to neighboring nodes at block 206. A first node is a neighbor of a second node if the first node is coupled directly to the second node. In response to the propagated parameter value, values of parameters in neighboring nodes are adjusted for compatibility as shown in FIG. 3. If all data bus nodes are parameterized at decision block 204, but the value of one or more parameters has changed (210), propagation and configuration is repeated at blocks 206 and 208 to allow adjacent components to further adjust parameter values in response to the change.

FIG. 3 shows a flowchart of an example process for adjusting parameters of components in response to propagated values. Following a round of propagation, if a data bus node has not received a new value for a parameter at decision block 220, no configuration is performed for the data bus node. If a new value has been received, the value of the parameter of the data bus node is configured as shown at blocks 221-226. If the data bus node currently has a value of the parameter that was user-defined, such as was set at block 202 in FIG. 2, the value of the parameter is reasserted to the current user-defined value (i.e. the compatible value) at block 226. Otherwise, the propagated value is analyzed at decision block 222 to determine if the new value is compatible with the data bus node.

Compatibility may depend on the application, the components, and/or the parameter that is being configured. For example, compatibility may be strictly defined in a list of compatible values that may be retrieved from a data bus. In some other implementations, values may be presumed to be compatible unless the data bus node has a current value for the parameter that was user defined. If the value is determined to be compatible, the value of the parameter is changed to the new propagated value at block 224. Otherwise, the value of the parameter is set to a compatible value at block 226.

A number of AXI and non-AXI parameters may be configured using the flow illustrated in FIG. 2 and FIG. 3 including: interface frequency, data bus bit-width, reset configuration, AXI interface type, global clock settings, etc. In configuration of an AXI connection network, each component to be connected to the AXI data bus can be automatically configuration based on the state of a model parameter or bus interface parameter. For ease of explanation and illustration, the examples and embodiments relating to configuration of a parameter are primarily described with reference to configuration of the parameter frequency. Other parameters may be automatically configured in a similar manner.

Figure 4:
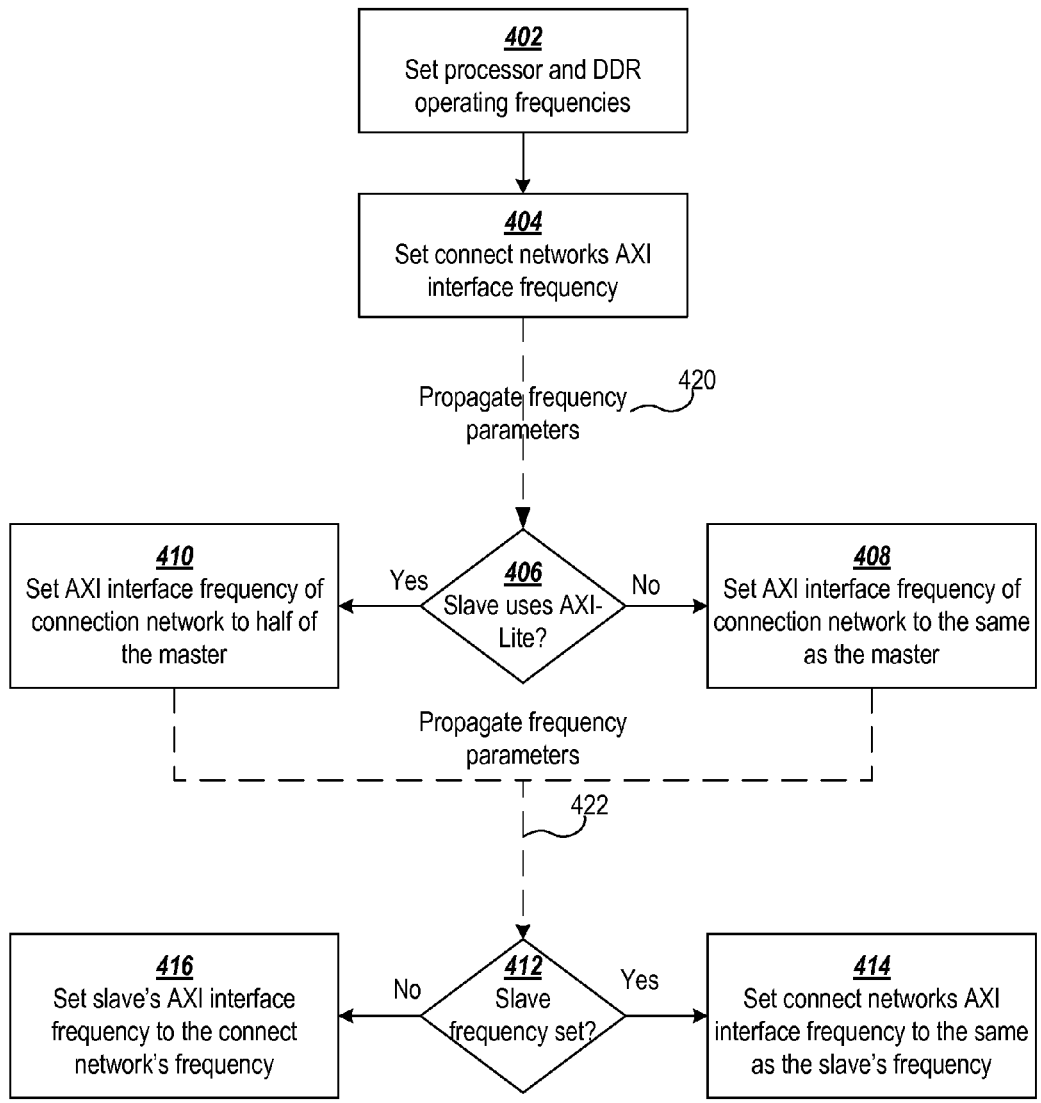
FIG. 4 shows the parameterization of frequency using the flow illustrated in FIGS. 2 and 3.

FIG. 4 shows a flowchart of an example process to parameterize a frequency parameter using the flow illustrated in FIGS. 2 and 3. In this example, processor and double data rate (DDR) memory operating frequencies are set by the user at block 402. Each node has a number of AXI interface connections connecting the node to other nodes in the connection network. The parameter of each AXI interface connection from the processor and DDR memory to other components is set to be equal to the parameter value of the processor or DDR memory at block 404. Frequency parameter values are propagated as illustrated by line 420 to data bus interfaces that are directly coupled to either the processor or to the DDR memory. If the slave component uses AXI-Lite (decision block 406), the frequency of the AXI interface connection to the slave component is set to be half that of the master component (i.e., the processor) at block 410. Otherwise, the frequency of the AXI interface connection to the slave component is set to be the same frequency value as the master component (i.e., the processor) at block 408. After setting frequency of the AXI interface connections, frequency parameter values are again propagated at 422. If the slave frequency has a user defined setting (decision block 412), the AXI interface frequency of the connection network is set to the same value as the frequency of the slave component (i.e., a compatible value) at block 414. Otherwise, the AXI interface frequency of the slave component is set to be equal to the propagated frequency value at block 416.

Figures 1, 5:
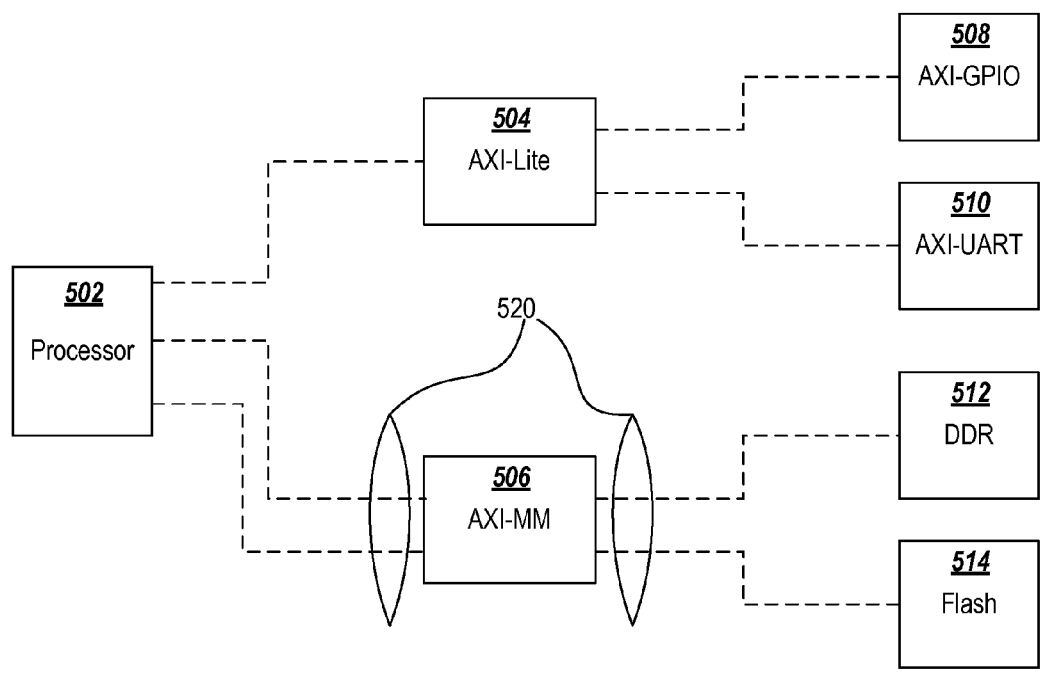
Figures 2, 5:
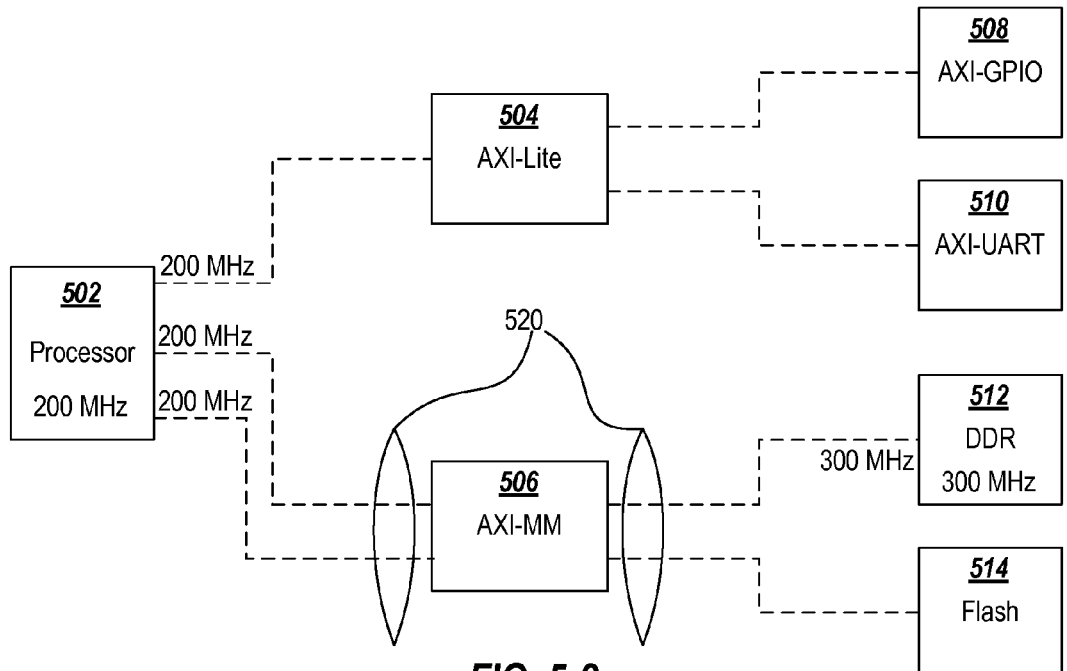
Figures 3, 5:
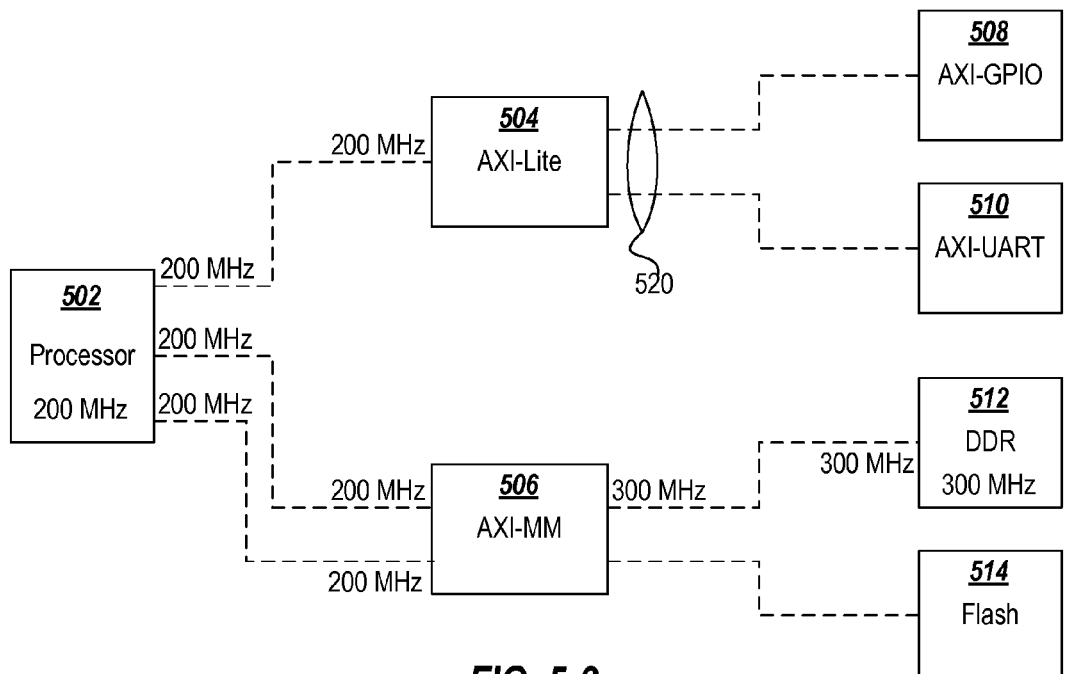
Figures 4, 5:
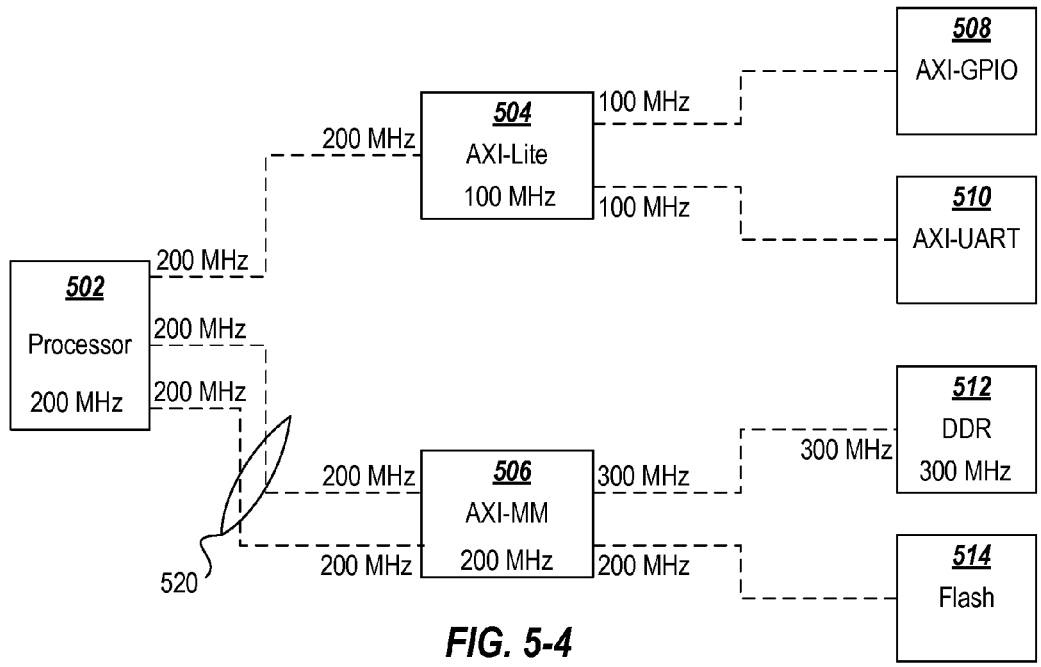
Figure 5:
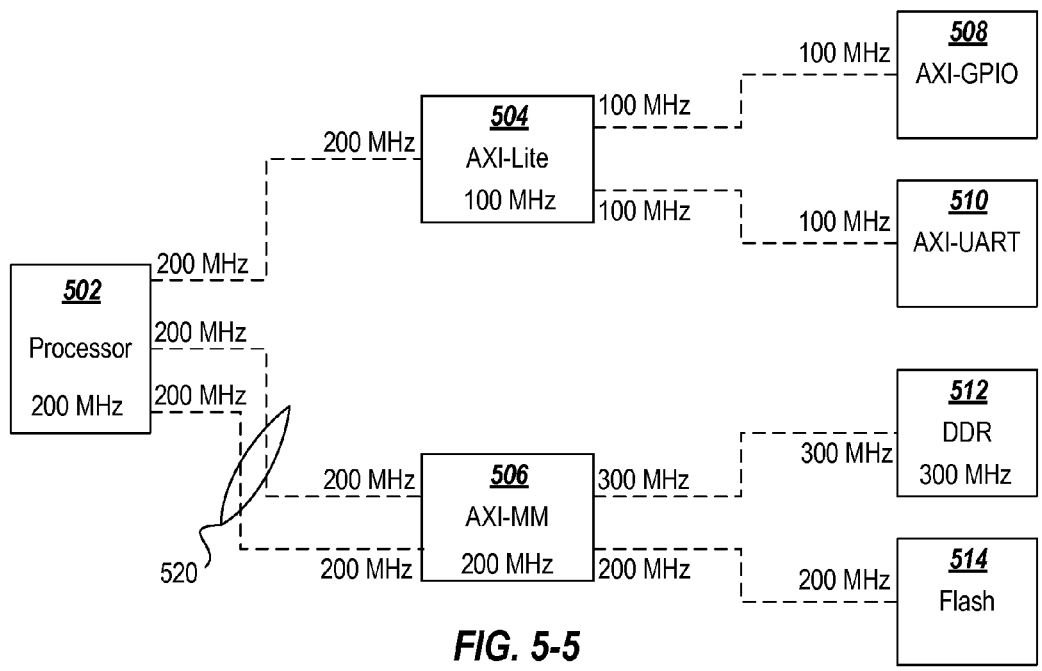

FIGS. 5-1 through FIGS. 5-8 illustrate parameterization of frequency for an example circuit design. FIGS. 5-1 illustrates a model of an un-parameterized data bus architecture. In this illustrative example, the model includes nodes representative of a processor 502, an AXI-lite data bus interface 504, and an AXI-MM data bus interface 506 that are included in the circuit design. The model also includes nodes representative of components AXI-GPIO 508, AXI-UART 510, DDR memory 512, and flash memory 514 that are connected to the processor 502 via the data bus interface nodes 504 and 506. Each node is connected to one or more other nodes by a number of AXI interface connections 520. In FIGS. 5-2, parameter values are set for one or more nodes of the model. In this example, frequency parameter values are set for nodes 502 and 512 that correspond to a processor and a DDR memory, respectively. The frequency parameter of the processor node 502 is set to 200 MHz and the frequency parameter of the DDR memory node 512 is set to 300 MHz. The frequency parameters of AXI interface connections 520 from nodes 502 and 512 are set to the parameter values of the respective nodes. The frequency values are propagated for each connection 520, as shown in FIGS. 5-3, to the neighboring nodes 504 and 506. In particular, the frequency value 200 MHz is propagated from node 502 to node 504 and to node 506, and the frequency value 300 MHz is propagated from node 512 to node 506.

Figures 5, 6:
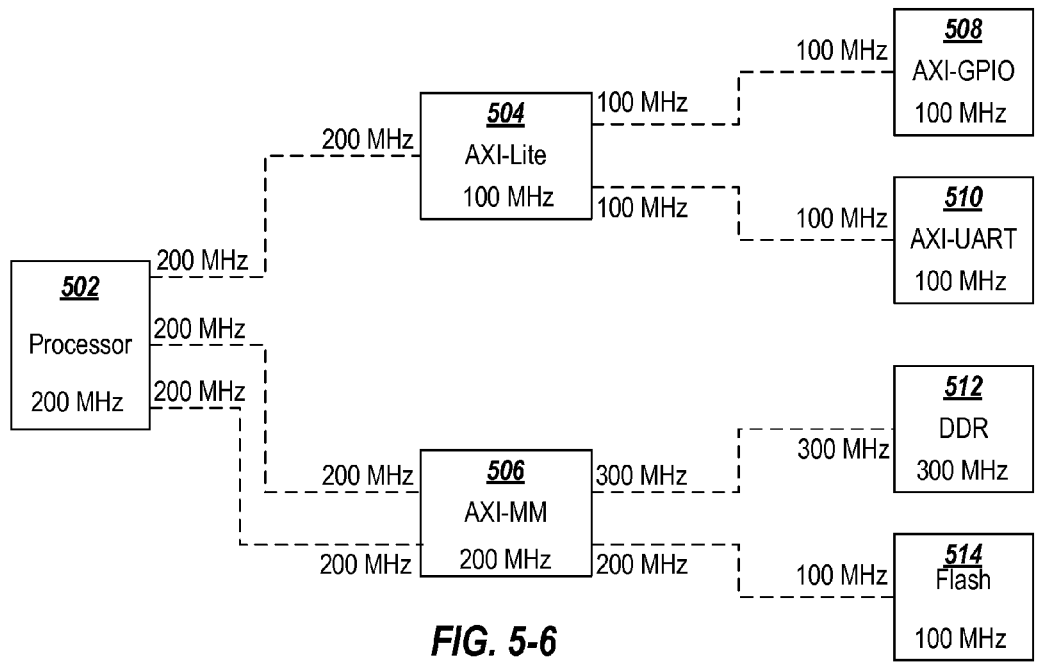
Figures 5, 6, 7:
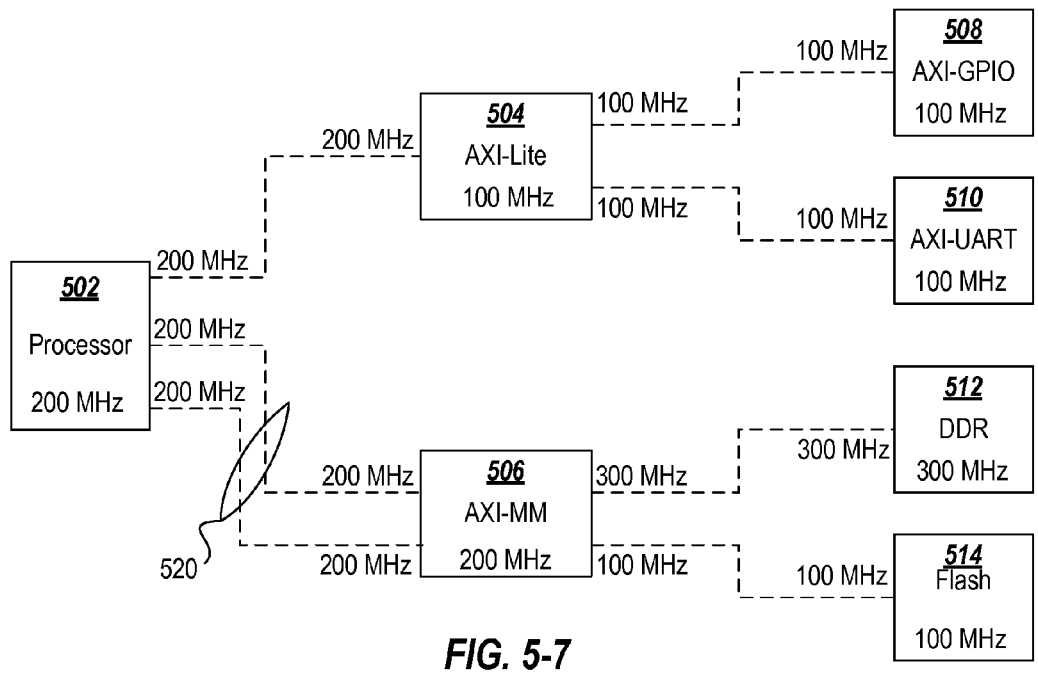
Figure 6:
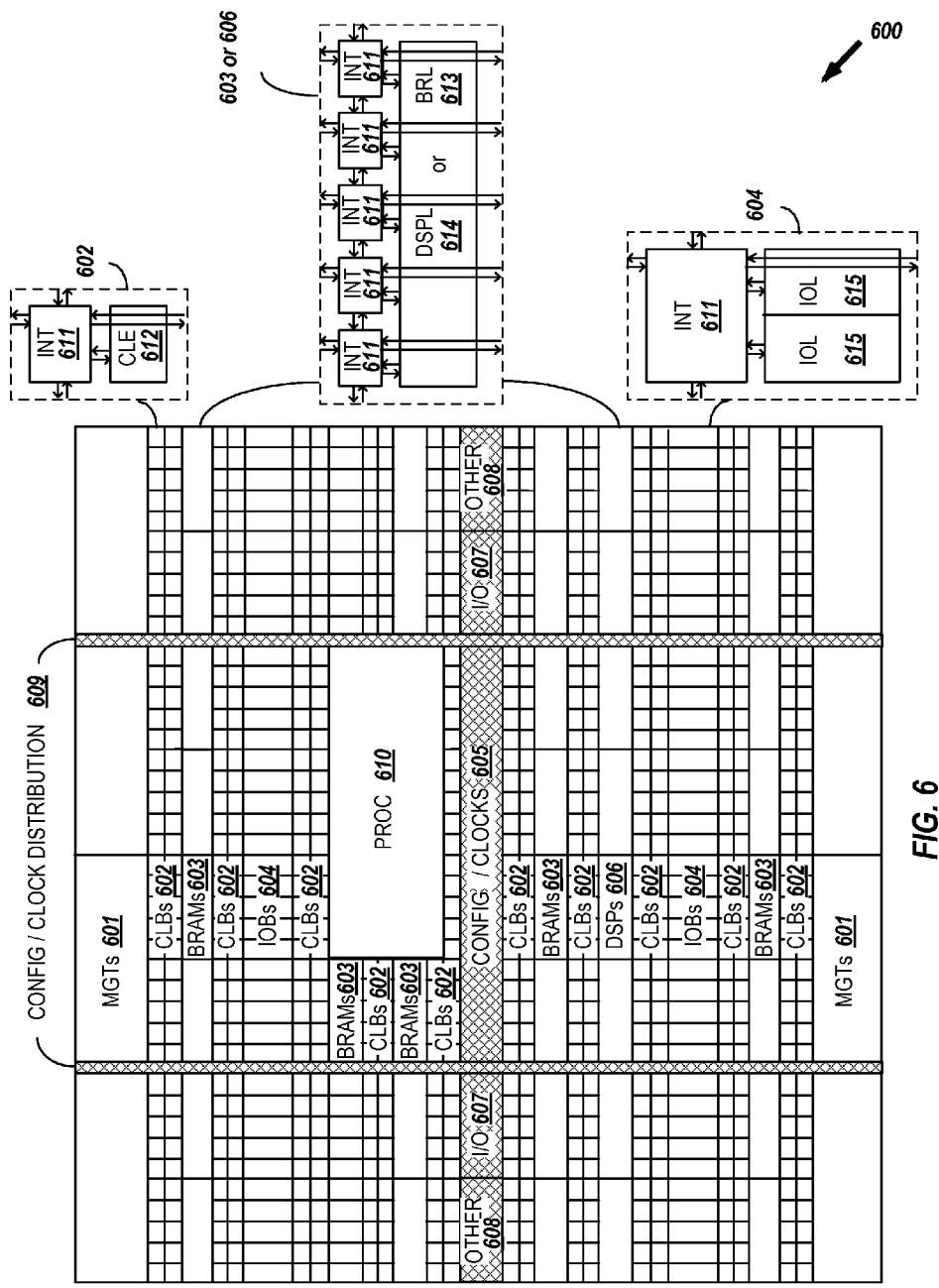
Figure 7:
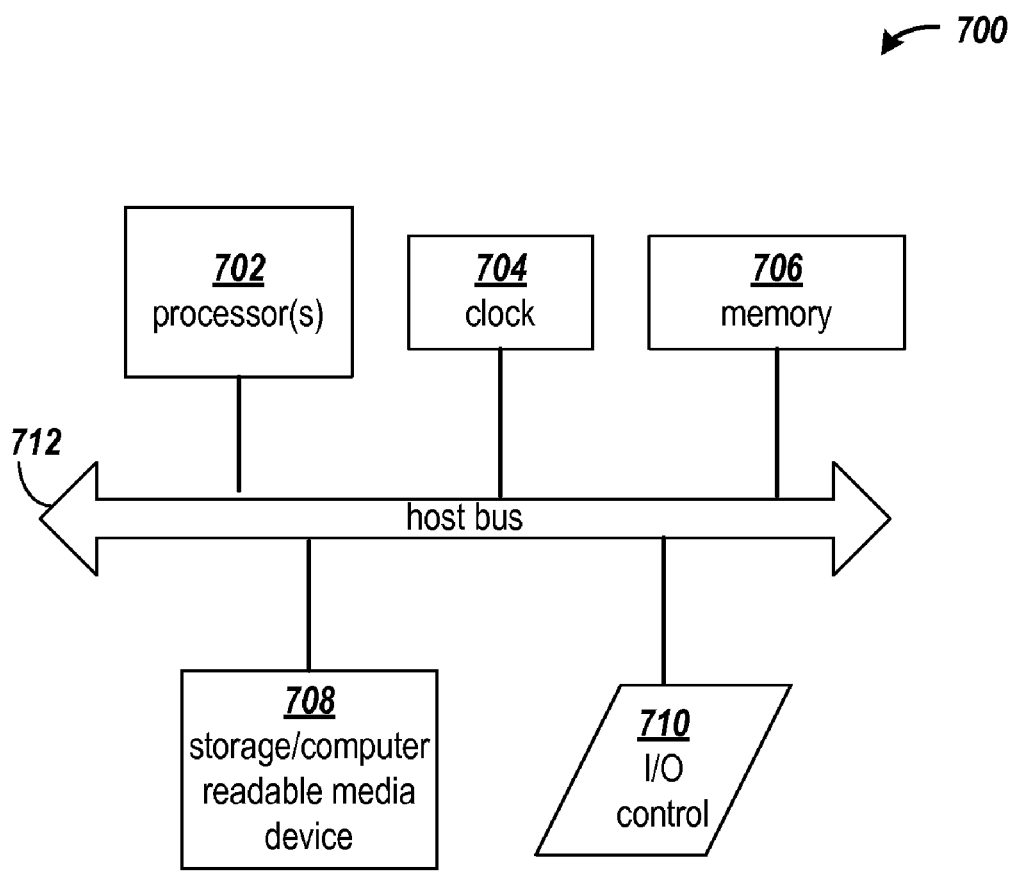

Nodes 504 and 506 are configured as shown in FIGS. 5-4. At this point, the frequency parameter of the AXI-Lite and AXI-MM interface nodes are configured. Node 506 is configured to use a frequency that is half that of the processor as required to implement AXI-Lite. Each AXI interface connection 520 from nodes 504 and 506, which are not yet set, is set to the parameter value of the respective node. In this example, AXI interface connections 520 from node 504 to nodes 508 and 510, and from node 506 to node 514, are configured. The configured AXI interface connection frequencies are propagated to directly connected nodes 502, 508, 510, 512, and 514 as shown in FIGS. 5-5. Nodes 508, 510, and 514, which have not yet been configured and have received the propagated values, are configured as shown in FIGS. 5-6. In this example, nodes 508 and 510 accept the propagated values as compatible values. However, the value propagated to node 514 is identified as incompatible. As a result, the operating frequency of node 514 and the frequency of the AXI interface connection of node 514 are set to 100 MHz. The new frequency value of node 514 is propagated, as shown in FIGS. 5-7, back to node 506. The propagated value of 100 MHz is compatible with node 506 so the 100 MHz is used by node 506 as the frequency for the AXI-interface connection to node 514. At this point, configuration is complete because all frequency parameters are set and no parameter values are changed in self-configuration of nodes following the last propagation.

FIG. 6 is a block diagram of an example FPGA that may be configured to implement one or more data bus interface circuits in accordance with one or more embodiments. The data bus interface circuits may be implemented in programmable logic or using dedicated hardware. FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, clock ports, and other programmable logic 608, such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear in order to facilitate the efficient implementation of user logic.

Those skilled in the art will appreciate that various storage devices may be suitable for storing configuration data for implementing the operations and structures described herein on a programmable integrated circuit. Such storage devices are processor-readable, and programmable elements of the IC, when programmed with the configuration data, operate consistent with the processes described herein. Other alternative embodiments may include a computing arrangement, including one or more processors and a memory arrangement configured with program code, would be suitable for hosting the processes and data structures of the different embodiments of the present invention.

FIG. 7 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 702 may be one or more general purpose processors, or a combination of one or more general purpose processors and suitable co-processors, or one or more specialized processors (e.g., RISC, CISC, pipelined, etc.).

The memory arrangement 706 typically includes multiple levels of cache memory, and a main memory. The storage arrangement 708 may include local and/or remote persistent storage such as provided by magnetic disks (not shown), flash, EPROM, or other non-volatile data storage. The storage unit may be read or read/write capable. Further, the memory 706 and storage 708 may be combined in a single arrangement.

The processor arrangement 702 executes the software in storage 708 and/or memory 706 arrangements, reads data from and stores data to the storage 708 and/or memory 706 arrangements, and communicates with external devices through the input/output control arrangement 710. These functions are synchronized by the clock signal generator 704. The resource of the computing arrangement may be managed by either an operating system (not shown), or a hardware control unit (not shown).

The disclosed embodiments are thought to be applicable to a variety of applications and tools related to circuit design and electronic circuitry. Other aspects and embodiments will be apparent to those skilled in the art from consideration of the specification. It is intended that the specification and illustrated embodiments be considered as examples only, with a true scope and spirit of the invention being indicated by the following claims.

What is claimed is:
1. A method of generating a circuit design, comprising:
instantiating in the circuit design in response to user input, a plurality of components including at least one processor and at least one peripheral device, the plurality of components having requirements, capabilities, and user-specified master-slave relationships;
automatically selecting, by a processor, one or more parameterizable data bus interface blocks based on the requirements, capabilities, and master-slave relationships of the components;
instantiating the one or more parameterizable data bus interface blocks in the circuit design;
assigning values, in response to user input, to parameters of the processor;
automatically determining data bus parameter values of the plurality of components and the one or more data bus interface blocks according to the parameters of the processor and capabilities and requirements of the plurality of components and one or more data bus interface blocks by propagating values of parameters between a plurality of data bus nodes representative of the plurality of components and of the one or more data bus interface blocks, and adjusting values of parameters of the plurality of components and the one or more interface blocks based on compatibility of the propagated values of parameters with the plurality of components and with the one or more interface blocks; and
parameterizing the one or more data bus interface blocks and components according to the determined data bus parameters.

2. The method of claim 1, wherein instantiating the plurality of components includes, in response to user input indicating the at least one processor, selecting one or more required components for the at least one processor.

3. The method of claim 2, wherein assigning values to parameters of the processor includes assigning values to parameters of the one or more required components.

4. The method of claim 1, wherein the propagation of parameters, and the adjusting of the values of parameters includes:
   propagating a respective value of a parameter of each data bus node of a plurality of data bus nodes to each data bus node directly coupled to the data bus node;
   in response to the parameter value propagated to one of the plurality of nodes and the parameter value being compatible with the one of the plurality of nodes and differing from a current parameter value of the one of the plurality of nodes, setting the parameter value of the one of the plurality of nodes to the propagated parameter value;
   in response to the parameter value propagated to one of the plurality of nodes and the parameter value not being compatible with the one of the plurality of nodes, setting the parameter value of the one of the plurality of nodes to a compatible value; and
   in response to propagating the respective value of the parameter and setting the value of the parameter for one or more of the plurality of data bus nodes, repeating the propagating step.

5. The method of claim 4, wherein the determining of data bus parameter values further includes:
   in response to first and second values of a parameter propagated to one of the data bus nodes, the first value being compatible with the one node, and the second value being incompatible with the node, setting the parameter of the one data bus node to the first value.

6. The method of claim 4, wherein the determining data bus parameter values further includes:
   setting the parameter of one or more of the data bus nodes to a respective default value.

7. The method of claim 6, wherein the determining data bus parameter values includes reading from a database of components and associated default values of parameters, each respective default value for the parameter of the one or more data bus nodes.

8. The method of claim 2, wherein the one or more required components for the at least one processor include clock circuitry and a memory unit.

9. The method of claim 1, wherein the one or more parameterizable data bus interface blocks are selected from a set of parameterizable data bus interface blocks including at least one interconnect block that implements automatic address assignment.

10. The method of claim 1, further comprising:
    generating a graphical representation of the components and data bus interface blocks according to the master-slave relationships; and
    in response to a user command, modifying the data bus interface block used to connect one or more of the components.

11. A method of configuring communication parameters of a plurality of components in a circuit design, the method comprising:
    for one or more of the plurality of components, setting, by a processor, a respective value of a parameter of the one or more of the plurality of components in the circuit design;
    for each component of the plurality of components, propagating the respective value of the parameter to each other component of the plurality of components that is directly coupled to the component;
    in response to the respective value of the parameter propagated to one of the plurality of components, and being included in a set of compatible values of the parameter for the one component, setting the parameter of the one component to the propagated parameter value;
    in response to the respective value of the parameter propagated to the one component, the one component having the parameter set to a current value, and the propagated parameter value not included in the set of compatible values, retaining the current value of the parameter of the one component as the parameter value; and
    repeating the propagating in response to propagating the respective value of the parameter of the one or more of the plurality of components and setting the value of the parameter for one or more of the plurality of components.

12. The method of claim 11, further comprising, in response to the respective value propagated to the one component, the one component having the parameter set to a current value different from the propagated value, the current value is not user-specified, and the propagated value included in the set of compatible values, setting the value of the parameter of the one component to the propagated value.

13. The method of claim 11, further comprising, in response to the respective value propagated to the one component, the one component having the parameter set to a current value different from the propagated value, and the current value is user-specified, setting the propagated value to the current value.

14. The method of claim 11, wherein the propagating of the parameter value includes:
    for each component of the plurality of components, not having a set parameter value, propagating one or more values of a parameter compatible with the component to components coupled directly to the component.

15. The method of claim 11, wherein the plurality of components are coupled to a data bus.

16. The method of claim 11, wherein one or more of the plurality of components are IP-Cores included in the circuit design.

17. An article of manufacture, comprising:
    a non-transitory processor-readable medium configured with configuration data that when executed by a processor, cause the processor to generate a circuit design by performing a method comprising:
    instantiating in the circuit design, in response to user input, a plurality of components including at least one processor and at least one peripheral device, the plurality of components having requirements, capabilities, and user-specified master-slave relationships;
    selecting one or more parameterizable data bus interface blocks based on the master-slave relationships, requirements, and capabilities of the components;
    instantiating the one or more parameterizable data bus interface blocks in the circuit design;
    assigning values, in response to user input, to parameters of the processor;
    determining data bus parameter values of the plurality of components and the one or more data bus interface blocks according to the parameters of the processor and capabilities and requirements of the plurality of components and one or more data bus interface blocks by propagating values of parameters between a plurality of data bus nodes representative of the plurality of components and of the one or more data bus interface blocks, and adjusting values of parameters of the plurality of components and the one or more interface blocks based on compatibility of the propagated values of parameters with the plurality of components and with the one or more interface blocks; and parameterizing the one or more data bus interface blocks and components according to the determined data bus parameters.

18. The article of claim 17, wherein the propagation of the values of parameters, and the adjusting of values of parameters includes:

propagating a respective value of a parameter of each data bus node of a plurality of data bus nodes to each data bus node directly coupled to the data bus node;

in response to the parameter value propagated to one of the plurality of nodes and the parameter value being compatible with the node and differing from a current parameter value of the node, setting the parameter value of the node to the propagated parameter value;

in response to the parameter value propagated to one of the plurality of nodes and the parameter value not being compatible with the node, setting the parameter value of the node to a compatible value; and in response to propagating the respective value of the parameter and setting the value of the parameter for one or more of the plurality of data bus nodes, repeating the propagating step.

19. The article of claim 18, wherein the determining of data bus parameter values further includes:

in response to first and second values of a parameter propagated to one of the data bus nodes, the first value being compatible with the one node, and the second value being incompatible with the node, setting the parameter of the one data bus node to the first value.

* * * * *